United States Patent
Nishino et al.

[11] Patent Number: 6,055,724
[45] Date of Patent: May 2, 2000

[54] METHOD AND DEVICE FOR SEALING IC CHIP

[75] Inventors: Kenichi Nishino, Osaka; Shinji Kanayama, Kashihara; Hiroyuki Otani, Ikoma; Kohei Enchi, Osaka; Hiroyuki Yoshida, Kadoma, all of Japan

[73] Assignee: Matsushita Electric Industrial Co., Ltd., Osaka, Japan

[21] Appl. No.: 09/155,720

[22] PCT Filed: Feb. 2, 1998

[86] PCT No.: PCT/JP98/00447

§ 371 Date: Oct. 2, 1998

§ 102(e) Date: Oct. 2, 1998

[87] PCT Pub. No.: WO98/34276

PCT Pub. Date: Aug. 6, 1998

[30] Foreign Application Priority Data

Feb. 4, 1997 [JP] Japan ........................................ 9-21126

[51] Int. Cl.[7] .............................. H01R 43/00; B23P 19/00
[52] U.S. Cl. .................................. 29/855; 29/740; 29/832
[58] Field of Search ............................. 29/740, 832, 741, 29/855, 854

[56] References Cited

FOREIGN PATENT DOCUMENTS

| | | |
|---|---|---|
| 4-171435 | 4/1992 | Japan . |
| 4111435 | 4/1992 | Japan . |
| 6-343912 | 12/1994 | Japan . |
| 8-153738 | 6/1996 | Japan . |
| 8-153741 | 6/1996 | Japan . |

*Primary Examiner*—Carl J. Arbes
*Attorney, Agent, or Firm*—Price, Gess & Ubell

[57] ABSTRACT

A method and device for sealing an IC chip are provided, by which a sealing material is surely discharged onto the upper surface of a circuit board, and the occurrence of imperfect sealing can be eliminated. A first gap ($h1$) is provided between an application nozzle (15) and a circuit board (13) on which an IC chip (12) is mounted before discharging the sealing material (17), after which a second gap ($h2$) which is greater than the first gap ($h1$) is provided between the application nozzle (15) and the circuit board (13) while discharging the sealing material (17), thereby accomplishing the sealing of the IC chip (12), and ensuring that the sealing operation is performed after the sealing material (17) has completely come to contact with the upper surface of the circuit board (13).

11 Claims, 4 Drawing Sheets

METHOD AND DEVICE FOR SEALING IC CHIP

TECHNICAL FIELD

The present invention relates to a method and device for sealing an IC chip mounted on a substrate by a flip-chip mounting method.

BACKGROUND ART

In a flip-chip mounting method or multi-chip mounting method which has become more and more popular in recent years, sealing of the IC chip, after it has been mounted on a circuit board, according to a conventional method, was performed generally as shown in FIG. 3.

In FIG. 3, a circuit board 3, on which an IC chip 2 is mounted, is fixedly set by suction force on a block 1 which is heated to a prescribed temperature, for example 60° C., and inclined at a predetermined angle θ, for example 15°. A sealing material (epoxy phenol resin) 5 is applied onto an upper surface 2a of the IC chip 2 by a dispenser 4 so as to let the sealing material 5 to run into between the IC chip 2 and the circuit board 3 by the 15° inclination of the block 1, thereby accomplishing the sealing of the IC chip 2.

FIG. 4 shows the positional relationship between an application nozzle 4a of the dispenser 4 and the circuit board 3. As shown, the application nozzle 4a is positioned at a location where there is a gap h of, for example 0.2 mm, between the circuit board 3 and itself, before discharging the sealing material 5.

However, with the conventional sealing method as described above, when the discharge of the sealing material is started under such a condition that said gap h between the application nozzle 4a and the circuit board 3 is wider due to variation in dimensions such as thickness of the block 1 or the circuit board 3, the sealing material 5 is discharged on the IC chip 2 as shown in FIG. 5, which causes imperfect sealing.

In view of the problem in the prior art as described above, it is an object of the present invention to provide a method and device for sealing an IC chip by which the occurrence of imperfect sealing can be eliminated by surely feeding a sealing material onto the upper surface of a circuit board.

DISCLOSURE OF INVENTION

The method of sealing an IC chip of the present invention is characterized by having the steps of: providing a first gap between an application nozzle and a board on which an IC chip has been mounted before sealing the IC chip; discharging a sealing material; providing a second gap which is greater than the first gap between the application nozzle and the board; and discharging the sealing material so as to seal the IC chip. The sealing material is discharged in a state where the first small gap is provided, making sure that the sealing material will contact the upper surface of the board, after which the sealing is performed with the second gap appropriately formed. Therefore, the sealing material is surely applied onto the upper surface of the board, preventing it from being discharged onto the upper surface of the IC chip, by which the occurrence of imperfect sealing is prevented.

By discharging the sealing material for a certain period of time in a state that the application nozzle is positioned at a location where there is provided the first gap until the discharge of the sealing material is stabilized, the sealing operation can be stably performed. Further, by detecting the upper surface of the board before the sealing operation and determining the first gap and the second gap based on the detected position of the upper surface of the board, these gaps can be precisely determined, thereby preventing even more certainly the occurrence of imperfect sealing.

Also, the device for sealing an IC chip of the present invention is characterized in that a sealing material application head having an application nozzle and a position control means is provided with a contact detecting means for detecting a position where the tip of the application nozzle comes into contact with an upper surface of the board on which an IC chip is mounted, and that a gap which is to be provided between the application nozzle and the board is determined by making reference to the positional data detected by the contact detecting means. With this construction, the gaps are accurately determined, and the sealing material can be properly and reliably performed.

By constructing such that the position control means comprises a voice coil motor, and the contact detecting means comprises a means which detects a change in an electric current applied to the voice coil motor when the tip of the application nozzle comes to contact with the upper surface of the board, the gaps can be precisely determined by simply providing the voice coil motor, by which the sealing can be performed reliably and appropriately.

BEST MODES FOR CARRYING OUT THE INVENTION

A first embodiment of the method of sealing an IC chip of the present invention will be hereinafter described with reference to FIG. 1.

Figure 1:
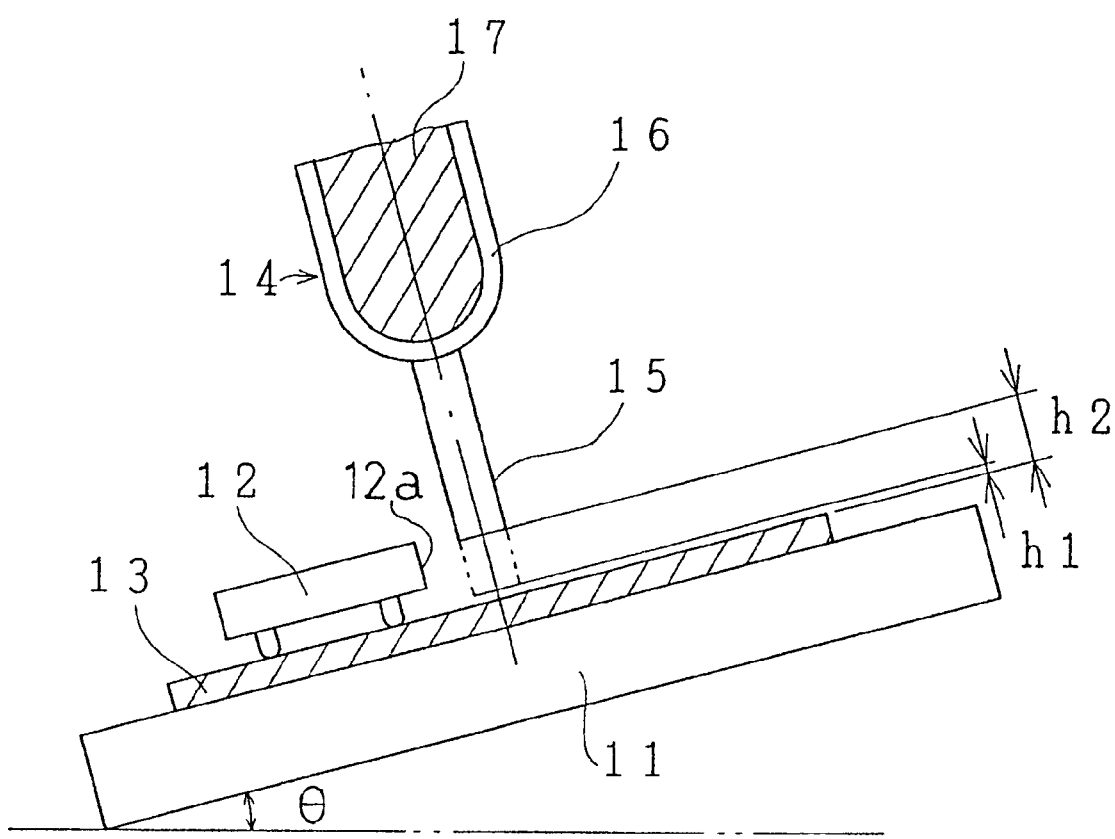
FIG. 1 is a partial sectional front view showing a method of sealing an IC chip according to a first embodiment of the present invention.

In FIG. 1, a circuit board 13, on which an IC chip 12 is flip-chip mounted, is fixedly set by suction force on a block 11 which is heated to a prescribed temperature, for example 60° C., and inclined at a predetermined angle θ, for example 15°. Next, an application nozzle 15 of a sealing material application head 14 is positioned at a location where there is provided a first gap h1 of, for example, 0.05 mm, between the application nozzle 15 and the circuit board 13, and discharge of a sealing material 17 contained in a syringe 16 is started. During the discharging operation, the application nozzle 15 is kept at the location where there is the first gap h1 between itself and the circuit board 13 for a certain period of time, for example 0.2 second, until the discharge of the sealing material 17 is stabilized. After the sealing material 17 has certainly contacted the circuit board 13, the application nozzle 15 is positioned at a location where there is a second gap h2 of, for example, 0.2 mm between the application nozzle 15 and the circuit board 13. Then, as in the prior art, the application nozzle 15 is moved along the upper surface 12a of the IC chip 12 while discharging the sealing material 17 for sealing the IC chip 12.

It is to be noted that the above said angle θ is not limited to 15°. It may be variously set depending on viscosity of the sealing material 17 or the space made between the circuit board 13 and the IC chip 12. Depending on conditions, the angle may even be set to be 0°.

Next, the method and device for sealing an IC chip according to a second embodiment of the present invention will be described with reference to FIG. 2.

Figure 2:
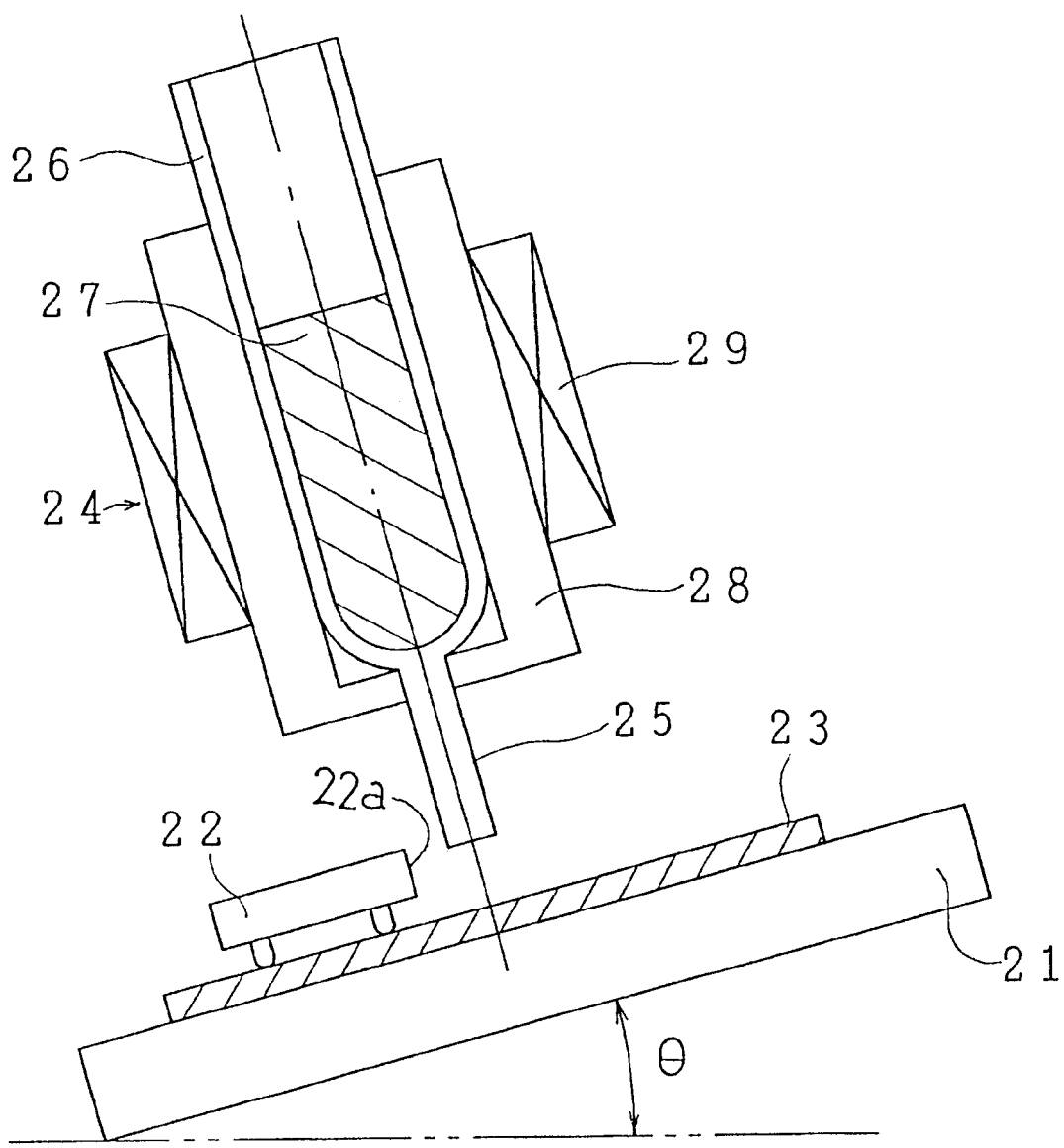
FIG. 2 is a partial sectional front view showing a method of sealing an IC chip according to a second embodiment of the present invention.
Figure 3:
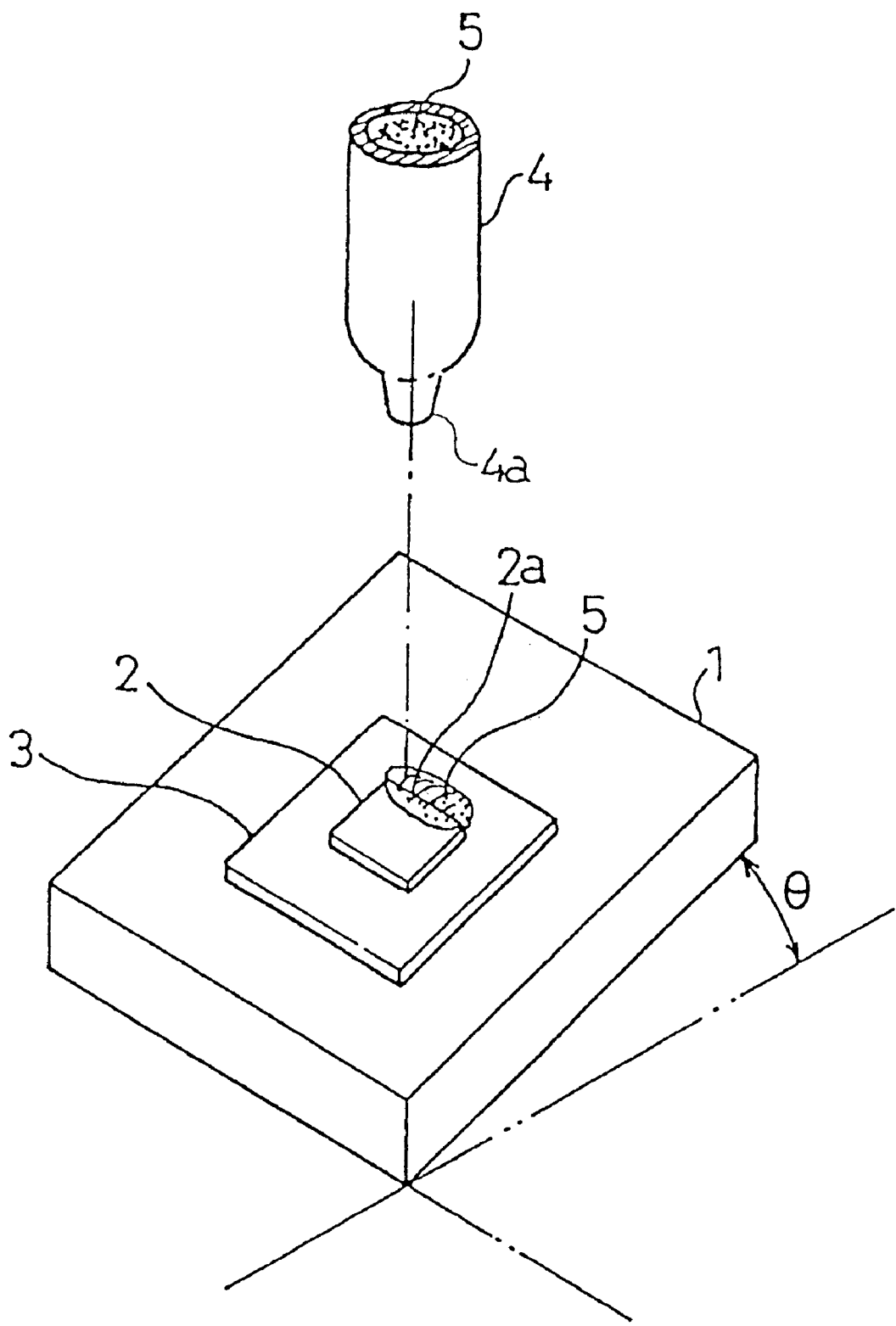
FIG. 3 is a perspective view showing a conventional method of sealing an IC chip.
Figure 4:
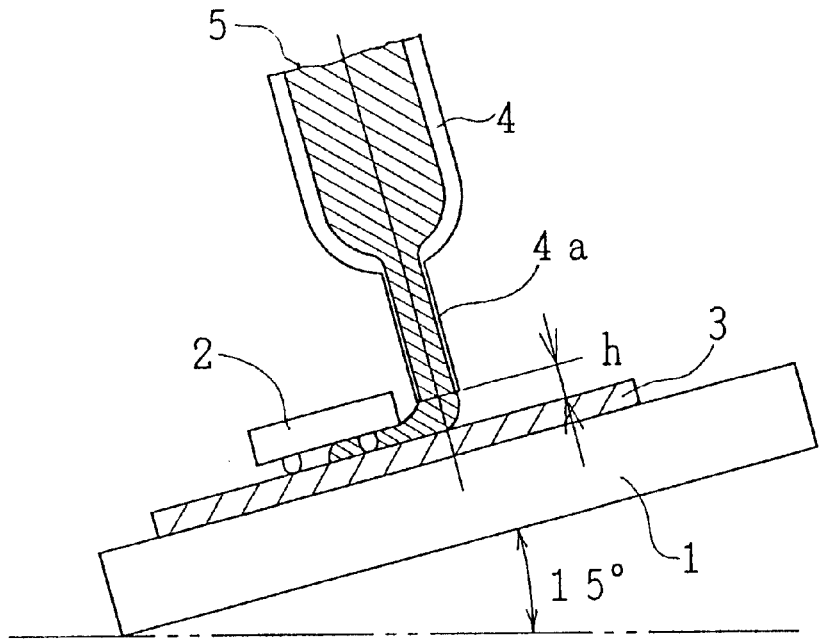
FIG. 4 is a partial sectional front view of the conventional method.
Figure 5:
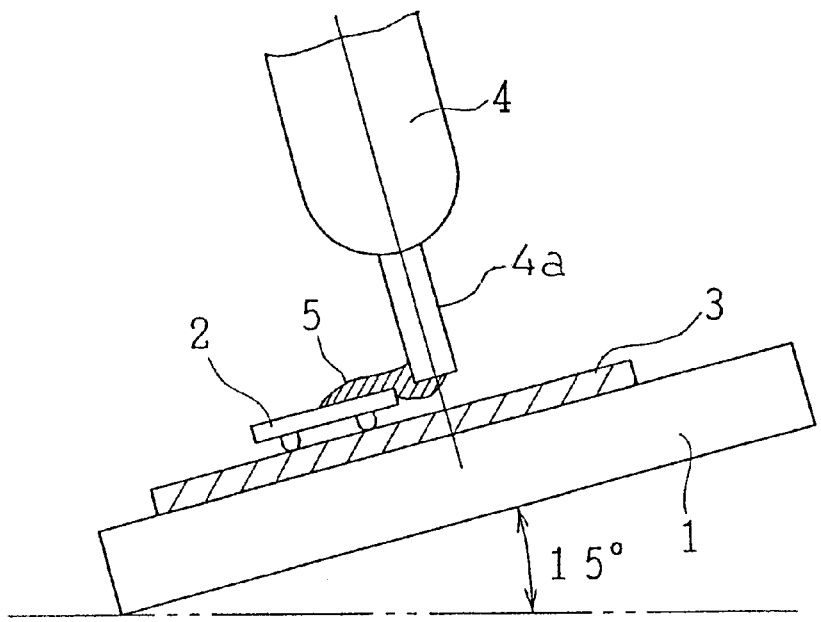
FIG. 5 is a partial front view showing a problem in the conventional method.

In FIG. 2, the sealing material application head 24 is constructed such that the sealing material 27 contained in a syringe 26 is discharged from an application nozzle 25, and that the application nozzle 25 can be positioned at any height by moving upwards and downwards a syringe holder 28 which holds the syringe 26 with a voice coil motor 29.

When sealing the IC chip 22, a circuit board 23 on which an IC chip 22 has been flip-chip mounted is fixedly set by suction force on a block 21 which is heated to a prescribed temperature, for example 60° C., and inclined at a predetermined angle θ, for example 15°. Next, an electric current is applied to the voice coil motor 29 for moving the sealing material application head 24 downwards so as to cause the tip of the application nozzle 25 to approach the circuit board 23. Using the fact that the current value applied to the voice coil motor 29 changes when the tip of the application nozzle 25 comes into contact with the upper surface of the circuit board 23, the application nozzle 25 is positioned such that a first gap h1 of, for example, 0.05 mm is formed between the application nozzle 25 and the circuit board 23 by controlling the current value applied to the voice coil motor 29 by making reference to the data on the position of the application nozzle with its tip being in contact with the circuit board 23. Discharge of the sealing material 27 contained in the syringe 26 is then started. While discharging the sealing material 27, the application nozzle 25 is kept to be at a location where the first gap h1 is formed for a certain period of time, for example 0.2 second, until the discharge of the sealing material 27 is stabilized. After the sealing material 27 has certainly contacted the circuit board 23, the application nozzle 25 is positioned such that a second gap h2 is formed between the application nozzle 25 and the circuit board 23, again by controlling the current value applied to the voice coil motor 29. After that, the application nozzle 25 is moved along the upper surface 22a of the IC chip 22 as in the prior art while discharging the sealing material 27, and the IC chip sealing action is completed.

INDUSTRIAL APPLICABILITY

As can be seen from the above description, the present invention is useful as a method and device for sealing an IC chip which has been flip-chip mounted on a circuit board, since the sealing material is applied on the circuit board without failure, and the sealing operation can be properly and stably performed by preventing imperfect sealing.

We claim:

1. A method of sealing an IC chip characterized by having the steps of:
    providing a first gap (h1) between an application nozzle (15,25) and a board (13,23) on which an IC chip (12, 22) has been mounted before sealing the IC chip;
    discharging a sealing material (17,27) between the IC chip (12,22) and the board (13,23);
    providing a second gap (h2) which is greater than the first gap (h1) between the application nozzle (15,25) and the board (13,23); and
    discharging the sealing material (17,27) so as to seal the IC chip (12,22).

2. The method of sealing an IC chip according to claim 1, wherein, in a state that the application nozzle (15, 25) is positioned at a location where there is provided the first gap (h1), the sealing material (17, 27) is discharged for a certain period of time until the discharge of the sealing material (17, 27) is stabilized.

3. The method of sealing an IC chip according to claim 1, wherein an upper surface of the board (13, 23) is detected before the sealing operation, and the first gap (h1) and the second gap (h2) are determined based on the detected position of the upper surface of the board.

4. The method of sealing an IC chip according to claim 2, wherein an upper surface of the board (13, 23) is detected before the sealing operation, and the first gap (h1) and the second gap (h2) are determined based on the detected position of the upper surface of the board.

5. A device for sealing an IC chip by discharging a sealing material between the IC chip and a board characterized in that a sealing material application head (24) having an application nozzle (25) and a position control means is provided with a contact detecting means for detecting a position where the tip of the application nozzle (25) comes into contact with an upper surface of the board (23) on which an IC chip (22) is mounted, and that a gap which is to be provided between the application nozzle (25) and the board (23) is determined by making reference to the positional data detected by the contact detecting means.

6. The device for sealing an IC chip according to claim 5, wherein the position control means comprises a voice coil motor (29), and the contact detecting means comprises a means which detects a change in an electric current applied to the voice coil motor (29) when the tip of the application nozzle (25) comes to contact with the upper surface of the board (23).

7. The device for sealing an IC chip according to claim 6, wherein the gap which is determined by making reference to the detected positional data is a first gap (h1) which is provided when the sealing material (27) is discharged at first, and a second gap (h2) which is greater than the first gap (h1) and provided when the sealing material (27) is discharged later.

8. The device for sealing an IC chip according to claim 5, wherein the gap which is determined by making reference to the detected positional data is a first gap (h1) which is provided when the sealing material (27) is discharged at first, and a second gap (h2) which is greater than the first gap (h1) and provided when the sealing material (27) is discharged later.

9. A method of sealing an IC chip, comprising the following steps:
    inclining a board (13, 23) at a predetermined angle;
    providing a first gap (h1) between an application nozzle (15,25) and the board (13, 23) on which an IC chip (12, 22) has been mounted;
    discharging a sealing material (17,27) between the IC chip (12, 22) and the board (13, 23) for a certain period of time until the discharge of the sealing material (17, 27) is stabilized;
    providing a second gap (h2) which is greater than the first gap (h1) between the application nozzle (15,25) and the board (13, 23); and
    discharging the sealing material (17, 27) so as to seal the IC chip (12,22).

10. A device for sealing an IC chip by discharging a sealing material between the IC chip and a board, the device comprising:

a voice coil motor (29) connected to an application nozzle (25);

a contact detecting means, connected to a position control means, and for detecting where the tip of the application nozzle (25) comes into contact with an upper surface of the board (23) on which an IC chip (22) is mounted;

said position control means for controlling the voice coil motor to position the application nozzle at a first gap (h1) above the board (23) to discharge sealing material between the IC chip and the board, and a second gap (h2) above the board (23) that is greater than the first gap (h1) when the discharge of sealing material is stabilized.

11. The device of claim 10 wherein the contact detecting means comprises a means for detecting a change in an electric current applied to the voice coil motor (29) when a tip of the application nozzle (25) comes into contact with the board (23).

* * * * *